United States Patent
Lin et al.

(10) Patent No.: US 8,330,508 B2
(45) Date of Patent: *Dec. 11, 2012

(54) PHASE-GENERATION CIRCUITRY WITH DUTY-CYCLE CORRECTION AND METHOD FOR GENERATING A MULTIPHASE SIGNAL

(75) Inventors: Feng Lin, Boise, ID (US); Roman Andreas Royer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 126 days.

This patent is subject to a terminal disclaimer.

(21) Appl. No.: 12/766,423

(22) Filed: Apr. 23, 2010

(65) Prior Publication Data

US 2010/0201416 A1    Aug. 12, 2010

Related U.S. Application Data

(63) Continuation of application No. 11/712,162, filed on Feb. 28, 2007, now Pat. No. 7,724,049.

(51) Int. Cl.
    *H03L 7/00* (2006.01)
(52) U.S. Cl. ......... 327/152; 327/144; 327/153; 327/161
(58) Field of Classification Search .................. 327/141, 327/144–163; 331/15–17; 375/373–376
    See application file for complete search history.

(56) References Cited

U.S. PATENT DOCUMENTS

| | | | |
|---|---|---|---|
| 6,002,273 A * | 12/1999 | Humphreys | 327/3 |
| 6,198,355 B1 | 3/2001 | Lindquist | |
| 6,690,243 B1 | 2/2004 | Henrion | |
| 6,870,415 B2 * | 3/2005 | Zhang et al. | 327/274 |
| 6,900,679 B2 | 5/2005 | Watarai | |
| 6,952,123 B2 * | 10/2005 | Kizer et al. | 327/147 |
| 7,116,141 B2 | 10/2006 | Demone | |
| 7,292,670 B2 * | 11/2007 | Gupta et al. | 375/371 |
| 7,436,230 B2 * | 10/2008 | Kim | 327/158 |
| 2004/0264621 A1 * | 12/2004 | Mai | 375/376 |
| 2005/0031065 A1 * | 2/2005 | Gupta et al. | 375/371 |
| 2006/0001462 A1 | 1/2006 | Kim et al. | |
| 2007/0030937 A1 | 2/2007 | Yajima | |
| 2007/0120587 A1 * | 5/2007 | Haerle et al. | 327/158 |
| 2008/0036514 A1 * | 2/2008 | Tai | 327/158 |
| 2008/0204093 A1 | 8/2008 | Lin et al. | |

* cited by examiner

*Primary Examiner* — Lincoln Donovan
*Assistant Examiner* — Brandon S Cole
(74) *Attorney, Agent, or Firm* — Schwegman, Lundberg & Woessner, P.A.

(57) ABSTRACT

Embodiments of phase-generation circuitry and methods for generating a multiphase signal with duty-cycle correction are generally described herein. The phase-generation circuitry may include a plurality of controllable delay stages arranged in series and phase detector circuitry. Each delay stage may be configured to phase shift a differential signal based on a control signal. The phase detector circuitry may be configured to generate the control signal based on a first time difference and a second time difference. The first time difference may be a time difference between rising edges of a first component of the differential signal and a second component of a phase-shifted signal. The second time difference may be a time difference between falling edges of the first component of the differential signal and the second component of the phase-shifted signal. Other circuits, systems, and methods are described.

10 Claims, 5 Drawing Sheets

PHASE-GENERATION CIRCUITRY

PHASE-GENERATION CIRCUITRY WITH DUTY-CYCLE CORRECTION AND METHOD FOR GENERATING A MULTIPHASE SIGNAL

RELATED APPLICATION

This patent application is a continuation of U.S. patent application Ser. No. 11/712,162 filed Feb. 28, 2007, now U.S. Pat. No. 7,724,049 which is incorporated herein by reference in its entirety.

TECHNICAL FIELD

Some embodiments of the invention pertain to electronic circuits. Some embodiments pertain to circuits for generating multiphase signals. Some embodiments pertain to graphics memory chips.

BACKGROUND

Advances in technology result in digital circuitry operating at continually higher speeds. As the speed of operation increases, more distortion results as higher frequency clock signals are distributed to the various components of an integrated circuit (IC). Some conventional techniques regenerate the clock signals within the IC; however these techniques are sometimes affected by duty-cycle variations in the input clock signal.

Thus, there are general needs for circuitry and methods for distributing clock signals. There are also general needs for circuitry and methods for regenerating clock signals.

DETAILED DESCRIPTION

Figure 1:
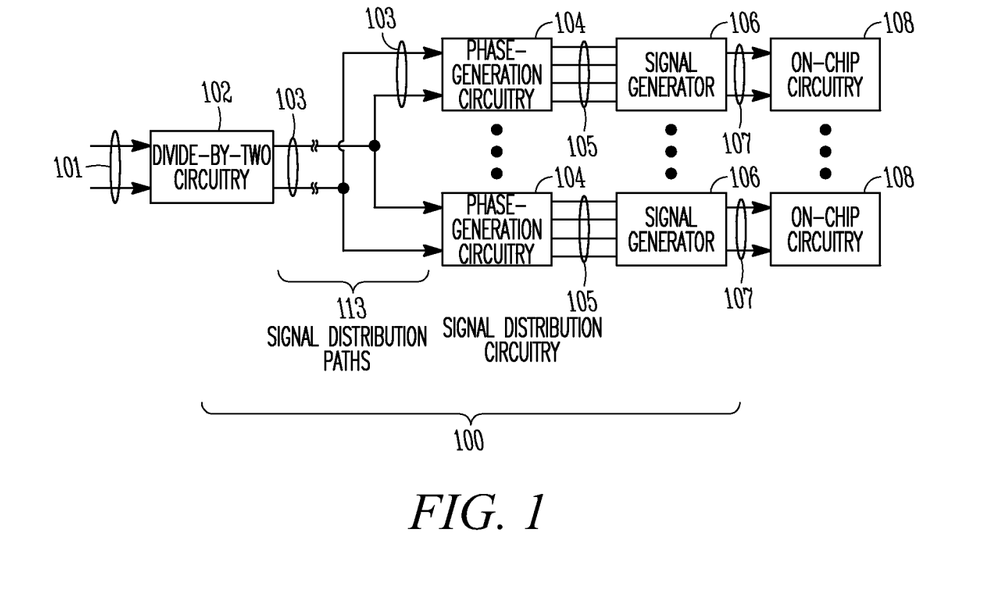
FIG. 1 is a diagram illustrating signal distribution circuitry in accordance with some embodiments of the invention.

FIG. 1 is a diagram illustrating signal distribution circuitry in accordance with some embodiments of the invention. Signal distribution circuitry 100 may be suitable for the distribution of differential signals within one or more integrated circuits. Signal distribution circuitry 100 divides the rate of differential input signal 101 by two, distributes the differential signal at half the input rate, and regenerates the input signal at the input rate for use by various components of the integrated circuit. In these embodiments, signal distribution circuitry 100 may include clock divider circuitry to divide the rate of differential input signal 101 to provide a divided differential signal. In some embodiments, the clock divider circuitry may comprise divide-by-two circuitry 102, as illustrated, to divide the rate of differential input signal 101 by two and provide half-rate differential signal 103, although the scope of the invention is not limited in this respect. Signal distribution circuitry 100 may also include signal distribution paths 113 to distribute half-rate differential signal 103 to one or more circuit elements. Signal distribution circuitry 100 may also include phase-generation circuitry 104 and corresponding signal generators 106. Phase-generation circuitry 104 may generate multiphase signal 105 from half-rate differential signal 103, and signal generator 106 may generate differential output signal 107 corresponding to differential input signal 101. Differential output signal 107 may be provided by signal distribution circuitry 100 to on-chip circuitry 108.

In some embodiments, phase-generation circuitry 104 includes a plurality of controllable delay stages and dual-edge phase detector circuitry. The controllable delay stages may be arranged in series and each delay stage may phase shift differential input signal 101 based on a control signal provided by the dual-edge phase detector circuitry. The dual-edge phase detector circuitry may generate the control signal to equalize a difference between corresponding rising edges and a difference between corresponding falling edges of signals operated on by the delay stages of the dual-edge phase detector circuitry. In this way, the controllable delay stages may generate the components of multiphase signal 105 substantially without the effects of any duty-cycle-distortion (DCD) that may be present in differential input signal 101. These embodiments are described in more detail below. The distribution of differential input signal 101 at half the rate (i.e., half the frequency) by signal distribution circuitry 100 may reduce distortion and/or jitter that may result when distributed at higher frequencies.

In some embodiments, differential output signal 107 may have a frequency ranging from less than 800 MHz up to 2 GHz or more, although the scope of these embodiments is not limited in this respect. The frequency of differential output signal 107 may be selected based on the number of delay stages, the semiconductor processing techniques used in fabrication, and voltage levels.

In some embodiments, signal distribution circuitry 100 may be part of a higher-level system, such as a memory circuit/chip, a microprocessor, a digital signal processor (DSP) or an application specific integrated circuit (ASIC). In these embodiments, on-chip circuitry 108 may be used to control timing with the higher-level system. In some of these embodiments, on-chip circuitry 108 may comprise a high-speed serial input-output (I/O) interface used to capture input data and/or provide output data, although the scope of these embodiments is not limited in this respect. In these embodiments, the high-speed serial I/O interface may capture or provide serial data at either the rate of differential output signal 107 or twice the rate of differential output signal 107. Differential output signal 107 may be at an external clock rate. Although illustrated in FIG. 1 for clarity, on-chip circuitry 108 is not necessarily part of signal distribution circuitry 100.

In some embodiments, signal distribution circuitry 100 may be part of a graphics memory chip/circuit, such as a graphics dynamic random access memory (DRAM). In these embodiments, on-chip circuitry 108 may be used to control the output timing of the graphics memory chip, although the scope of these embodiments is not limited in this respect. In some of these embodiments, on-chip circuitry 108 may used to provide output data from the graphics memory chip off both the rising and falling edges of differential output signal 107 to provide output data at twice the rate of differential output signal 107. The output data rate of the graphics memory chip may range from less than 1.6 Gigabits per second (Gbps) per pin up to 2.5 Gbps per pin.

Although signal distribution circuitry 100 is illustrated as having several separate functional elements, one or more of the functional elements may be combined and may be implemented by combinations of software-configured elements and/or other hardware elements. Although clock divider circuitry is illustrated as divide-by-two circuitry 102, clock divider circuitry may comprise almost any clock divider, such divide-by-four circuitry, which may generate an eight phase output having a forty-five degree phase shift between the signal components.

Figure 2:
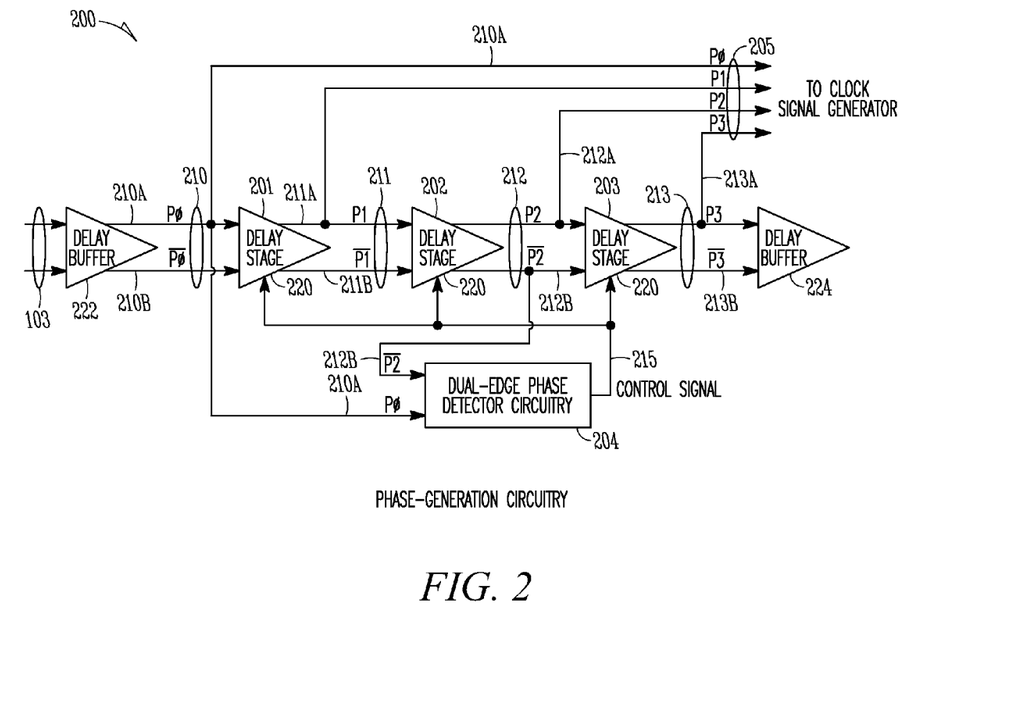
FIG. 2 is a block diagram of phase-generation circuitry in accordance with some embodiments of the invention.

FIG. 2 is a block diagram of phase-generation circuitry in accordance with some embodiments of the invention. Phase-generation circuitry 200 may be suitable for use as phase-generation circuitry 104 (FIG. 1), although other configurations may also be suitable. Phase-generation circuitry 200 comprises controllable delay stages 220 arranged in series and dual-edge phase detector circuitry 204. Each delay stage 220 may successively phase shift differential input signal 210 based on control signal 215. Dual-edge phase detector circuitry 204 may include logic circuitry to generate control signal 215 to equalize a difference between corresponding rising edges and a difference between corresponding falling edges of components 210A and 210B of differential input signal 210. This is described in more detail below. Differential input signal 210 may correspond to half-rate differential signal 103 (FIG. 1).

In some embodiments, controllable delay stages 220 may comprise first delay stage 201, second delay stage 202 and third delay stage 203 arranged respectively in series. Each delay stage 220 may phase-shift differential input signal 210 by approximately ninety-degrees, although the scope of these embodiments is not limited in this respect. In these embodiments, first delay stage 201 may delay first and second components 210A and 210B of differential input signal 210 by approximately ninety-degrees to provide respectively first and second components 211A and 211B of first phase-shifted signal 211. Second delay stage 202 may delay first and second components 211A and 211B of first phase-shifted signal 211 by approximately ninety-degrees to provide first and second components 212A and 212B of second phase-shifted signal 212. Third delay stage 203 may delay first and second components 212A and 212B of second phase-shifted signal 212 by approximately ninety-degrees to provide first and second components 213A and 213B of third phase-shifted signal 213. While ninety-degree phase shifts are described herein, other amounts of phase shift are possible.

In some embodiments, dual-edge phase detector circuitry 204 may comprise a dual-edge triggered phase detector to trigger off both rising edges and falling edges of its input signals. Dual-edge phase detector circuitry 204 may also include control circuitry to generate control signal 215 to equalize any difference between corresponding rising edges and corresponding falling edges of its input signals.

In these embodiments, first component 210A of the differential input signal 210, first component 211A of first phase-shifted signal 211, first component 212A of second phase-shifted signal 212, and first component 213A of third phase-shifted signal 211 may comprise multiphase signal 205. These components of multiphase signal 205 may have substantially a ninety degree phase shift therebetween regardless of any duty cycle distortion present in differential input signal 210. In these embodiments, only three ninety degree delay stages are sufficient to achieve the desired result, unlike many conventional phase generators that require four delay stages.

In some embodiments, the components of multiphase signal 205 may be provided to a signal generator, such as signal generator 106 (FIG. 1), to generate differential output signal 107 (FIG. 1) at twice the rate of differential input signal 210, although the scope of these embodiments is not limited in this respect. Signal generator 106 (FIG. 1) may use the rising edges of the components of multiphase signal 205, although this is not a requirement. In some alternate embodiments, signal generator 106 (FIG. 1) may generate a differential output signal using the falling edges of the components of multiphase signal 205, although the scope of these embodiments is not limited in this respect.

In some embodiments, differential input signal 210 may comprise a clock signal and may have at least some DCD. Differential input signal 210 may have a first clock rate (e.g., frequency). In these embodiments, differential output signal 107 (FIG. 1) may be a second clock signal having a second clock rate that is twice the first clock rate. In these embodiments, the effects of the DCD present in differential input signal 210 may be reduced and/or eliminated in differential output signal 107. This is discussed in more detail below.

In some embodiments, controllable delay stages 220 may comprise voltage-controllable delay stages. In these embodiments, the plurality of control signal 215 may comprise a voltage. Controllable delay stages 220 may comprise a voltage controlled delay line (VCDL). Each of delay stages 220 may comprise one or more delay elements (not separately illustrated). Each delay stage 220 may comprise three delay elements, although the scope of these embodiments is not limited in this respect. The number of delay elements within each delay stage 220 may be selected based on the frequency of differential input signal 210, among other things, to provide approximately ninety degrees of phase shift for each delay stage 220.

In some embodiments, phase-generation circuitry 200 may also comprise input delay buffer 222 and final delay buffer 224. Delay buffer 222 may be used to bridge input signals from digital clock signals, which may be rail-to-rail signals, to internal differential signals, such as differential input signal 210. In these embodiments, final delay buffer 224 may act as a load for delay stage 203. Delay buffers 222 and 224 may be identical to delay stages 220, although the scope of these embodiments is not limited in this respect. In these embodiments, delay buffers 222 and 224 may also be responsive to control signal 215, although the scope of these embodiments is not limited in this respect.

Although phase-generation circuitry 200 is illustrated as having several separate functional elements, one or more of the functional elements may be combined and may be implemented by combinations of software-configured elements, and/or other hardware elements. For example, delay stages 220 may comprise one or more delay elements to provide a desired amount of delay, and dual-edge phase detector circuitry may comprise combinations of various hardware and logic circuitry for performing at least the functions described herein.

Figure 3A:
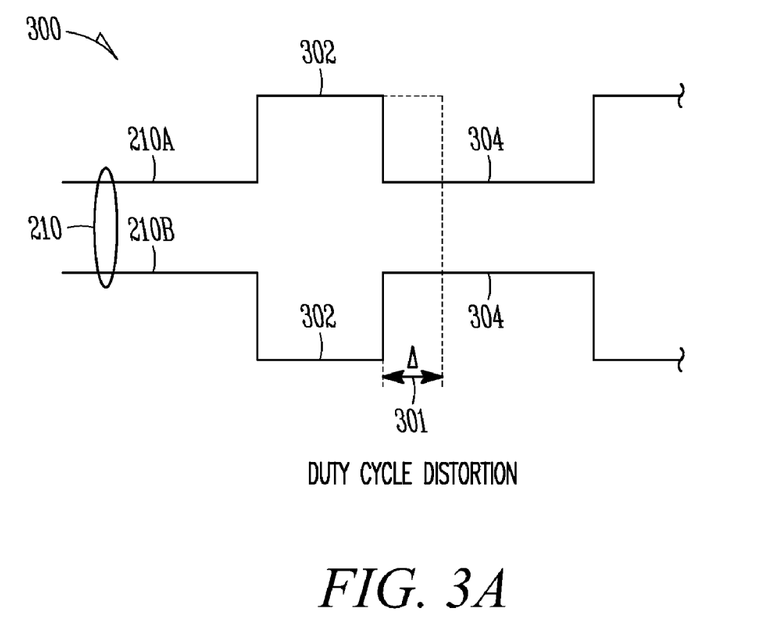
FIG. 3A illustrates duty-cycle-distortion that may be present in a differential signal, for correction using some embodiments of the invention.

FIG. 3A illustrates duty-cycle-distortion that may be present in a differential signal, for correction using some embodiments of the invention. Differential input signal 210 includes differential signal components 210A and 210B that are differential to each other. The duty cycle of differential input signal 210 depends on times 302 and 304. Differential input signal 210 has a 50% duty cycle when time 302 equals time 304. In some situations, differential input signal 210 may have a duty-cycle that is not 50%. In these situations, time 302 is not equal to time 304. As illustrated, time 302 is less than time 304 by time difference 301. In this example, differential signal component 210A may have a duty cycle of less than 50% (e.g., 45%) and differential signal component 210B may have a duty cycle greater than 50% (e.g., 55%). This difference in duty cycles may be referred to as DCD, which may be present on differential input signal 210.

Figure 3B:
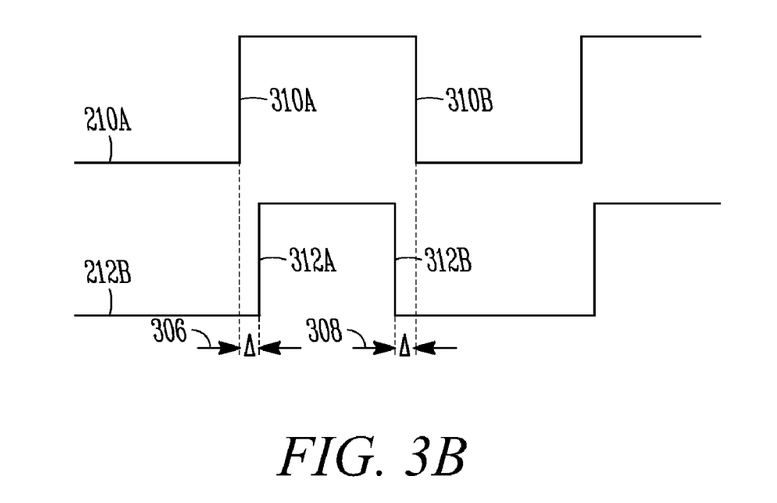
FIG. 3B illustrates time differences between in-sync signal components of phase-generation circuitry in accordance with some embodiments of the invention.

FIG. 3B illustrates time differences between in-sync signal components of phase-generation circuitry in accordance with some embodiments of the invention. Differential signal component 210A may correspond to a first component of differential input signal 210 (FIG. 2), and differential signal component 212B may correspond to a second component of differential signal 212 (FIG. 2) generated by delay stage 202 (FIG. 2). Differential signal component 210A has rising edge 310A and falling edge 310B as shown. Differential signal component 212B has rising edge 312A and falling edge 312B as shown.

As illustrated in FIG. 3B, rising edges 310A and 312A may have time difference 306 therebetween, and falling edges 310B and 312B may have time difference 308 therebetween. Due to DCD described in FIG. 3A, time difference 306 may be different from time difference 308. Differences between time difference 306 and time difference 308 may result in non-uniform offsets between the various components of multiphase signal 105 (FIG. 1). Dual-edge phase detector circuitry 204 (FIG. 2) may equalize time differences 306 and 308 and to help avoid non-uniform offsets between the components of multiphase signal 105.

Although FIG. 3B shows rising edge 310A of differential signal component 210A occurring before rising edge 312A of differential signal component 212B, and falling edge 310B of differential signal component 210A occurring after falling edge 312B of differential signal component 212B, some embodiments are equally suitable for use in the opposite situation. That is, in cases where rising edge 310A of differential signal component 210A may occur after rising edge 312A of differential signal component 212B, and falling edge 310B of differential signal component 210A may occur before falling edge 312B of differential signal component 212B.

Without the presence of DCD in differential input signal 210, dual-edge phase detector circuitry 204 may drive both time differences 306 and 308 towards zero. When both rising edge 310A and falling edge 310B lead or lag rising edge 312A and falling edge 312B, respectively, at the same time, dual-edge phase detector circuitry 204 may correct the time differences twice in a cycle (e.g., one at the rising edges and the other at falling edges). This may be referred as being 'double-pumped' in the same direction. With input DCD, the time differences 306 and 308 may cause dual-edge phase detector circuitry 204 to make corrections in opposite directions such that the average effect per cycle is no correction when time differences 306 and 308 are equal.

Referring to FIGS. 2 and 3B, in accordance with some embodiments, dual-edge phase detector circuitry 204 may generate control signal 215 based on time difference 306 and time difference 308. Delay stages 201, 202 and 203 and dual-edge phase detector circuitry 204 operate as a delay-locked loop (DLL). In these embodiments, dual-edge phase detector circuitry 204 may adjust control signal 215 to equalize first time difference 306 and second time difference 308. In these embodiments, control signal 215 may cause controllable delay stages 220 to either increase or decrease an amount of delay to equalize first time difference 306 and second time difference 308. In these embodiments, with DCD, an actual DLL type 'lock' might not actually occur, although the scope of these embodiments is not limited in this respect.

In these embodiments, after time differences 306 and 308 are equalized by dual-edge phase detector circuitry 204, differential signal component 210A and differential signal component 212B may be in-sync as shown in FIG. 3B. Rather than using differential signal components 210A and 212B, dual-edge phase detector circuitry 204 may use other in-sync signals, such as differential signal components 211A and 213B, differential signal components 211B and 213A, or differential signal components 210B and 212A. As used herein, these in-sync differential signal components may be referred to as 'same state' signals.

Figure 4:
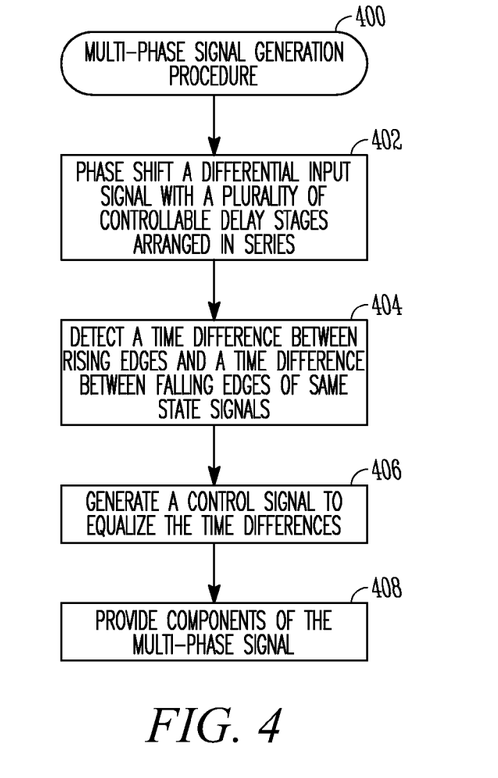
FIG. 4 is a flow chart of a multiphase signal generation procedure in accordance with some embodiments of the invention.

FIG. 4 is a flow chart of a multi-phase signal generation procedure in accordance with some embodiments of the invention. Multi-phase signal generation procedure 400 may be used to generate a multiphase signal, such as multiphase signal 105 (FIG. 1). Multi-phase signal generation procedure 400 may be performed by phase-generation circuitry 200 (FIG. 2), although other circuitry may also be used to perform procedure 400.

Operation 402 comprises phase shifting a differential input signal with a plurality of controllable delay stages arranged in series. Controllable delay stages 220 (FIG. 2) may delay differential input signal 210 (FIG. 2) to generate a plurality of delayed versions of differential input signal 210 (FIG. 2).

Operation 404 comprises detecting a time difference between rising edges and a time difference between falling edges of same stage signals. Dual-edge phase detector circuitry 204 (FIG. 2) may detect first time difference 306 between rising edges 310A (FIG. 3B) and 312A (FIG. 3B). In these embodiments, dual-edge phase detector circuitry 204 (FIG. 2) may detect a second time difference 308 (FIG. 3B) between falling edges 310B and 312B (FIG. 3B).

Operation 406 comprises generating a control signal to equalize the time differences. Dual-edge phase detector circuitry 204 (FIG. 2) generate control signal 215 (FIG. 2) to equalize time differences 306 (FIG. 3B) and 308 (FIG. 3B). The control signal may cause delay stages 220 (FIG. 2) to adjust an amount of delay provided.

Operation 408 comprises providing the components of the multiphase signal. Differential signal component 210A (FIG. 2), differential signal component 211A (FIG. 2), differential signal component 212A (FIG. 2), and differential signal component 213A (FIG. 2) may comprise the components of multiphase signal 205 (FIG. 2). Either the rising or falling edges of the components of multiphase signal 205 (FIG. 2) may be used to regenerate a clock signal.

Although the individual operations of multi-phase signal generation procedure 400 are illustrated and described as separate operations, one or more of the individual operations may be performed concurrently, and nothing requires that the operations be performed in the order illustrated.

Figure 5:
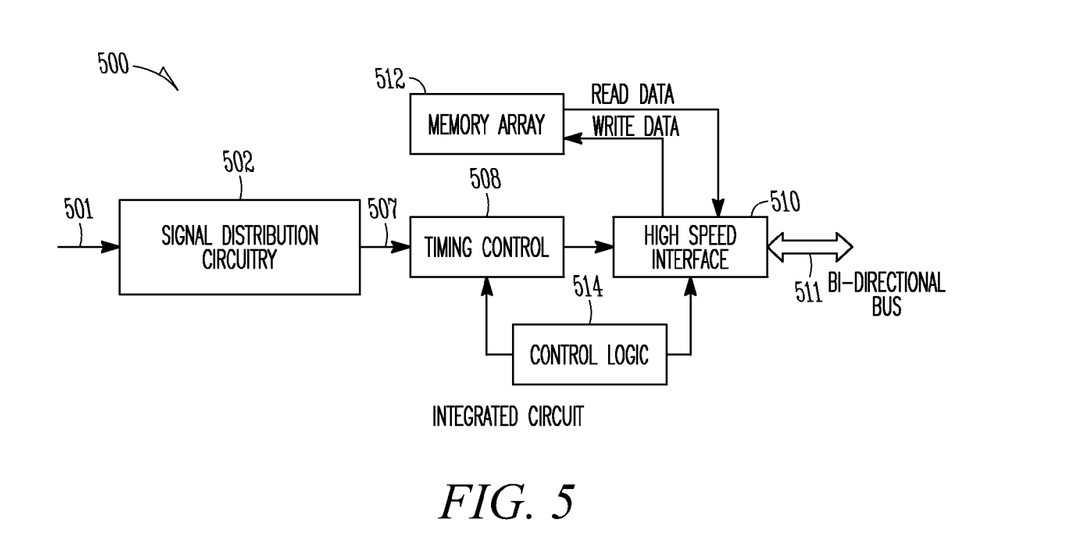
FIG. 5 is a block diagram of an integrated circuit in accordance with some embodiments of the invention.

FIG. 5 is a block diagram of an integrated circuit in accordance with some embodiments of the invention. Integrated circuit 500 may include signal distribution circuitry 502 to distribute a half-rate differential signal within the integrated circuit. Signal distribution circuitry 502 may divides the rate of differential input signal 501 by two, may distribute the differential signal at half the input rate as a half-rate differential signal, and may regenerate differential input signal 101 at the input rate to provide differential output signal 507.

Integrated circuit 500 may also include timing control circuitry 508 and high-speed interface 510. Timing control circuitry may generate timing control signals from differential output signal 507 for use by high-speed interface 510. High-speed serial interface 510 may communicate data over bi-directional bus 511. Integrated circuit 500 may include memory array 512 to store data that may be received through high-speed serial interface 510 over bi-directional bus 511 and to store data that is to be provided through high-speed serial interface 510 over bi-directional bus 511.

In some embodiments, high-speed serial interface 510 may provide output data off the leading and falling edges of differential output signal 507, allowing output data to be provided at twice the external rate (e.g., twice the rate of differential output signal 507), although the scope of these embodiments is not limited in this respect.

In some embodiments, integrated circuit 500 may also include control logic 514 to control the operations timing control circuitry 508 and high-speed interface 510 to allow integrated circuit 500 to communicate bi-directionally over bi-directional bus 511.

In some embodiments, signal distribution circuitry 502 may comprise clock-divider circuitry to generate the half-rate differential signal from a full-rate clock signal, such as differential input signal 501. Signal distribution circuitry 502 may also comprise phase-generating circuitry to generate a multiphase signal from the half-rate differential signal, and signal generating circuitry to generate differential output signal 507. Signal distribution circuitry 502 may also comprise a clock-signal distribution path to distribute the half-rate differential signal from the clock-divider circuitry to the phase-generating circuitry.

In some embodiments, the phase-generating circuitry may comprise a plurality of controllable delay stages arranged in series, and dual-edge phase detector circuitry to generate to control the delay stages based on corresponding rising edges and corresponding falling edges of same-state signals operated on by the delay stages. In these embodiments, each delay stage may phase shift a differential input signal based on a control signal provided by the dual-edge phase detector circuitry. Phase-generating circuitry 200 (FIG. 2) may be suitable for use as the phase-generating circuitry used within signal distribution circuitry 502, although the scope of these embodiments is not limited in this respect.

In some embodiments, signal-distribution circuitry 100 (FIG. 1) may correspond to signal distribution circuitry 502 and timing control circuitry 508. In these embodiments, differential input signal 501 may correspond to differential input signal 101 (FIG. 1), differential output signal 507 may correspond to differential output signal 107 (FIG. 1), and timing control circuitry 508 may correspond to on-chip circuitry 108 (FIG. 1), although the scope of these embodiments is not limited in this respect.

Integrated circuit 500 may be almost any type of integrated circuit including a memory chip, such as a graphics dynamic random access memory (GDRAM), although the scope of these embodiments is not limited in this respect. Integrated circuit 500 may be suitable for use in an imaging system, or a non-volatile storage device. Although integrated circuit 500 is illustrated as having several separate functional elements, one or more of the functional elements may be combined and may be implemented by combinations of software-configured elements and/or other hardware elements. Although the circuitry illustrated in FIG. 5 is described as an integrated circuit, at least some of circuitry illustrated in FIG. 5 may also be part of almost any integrated circuit, including a DSP or an ASIC.

Figure 6:
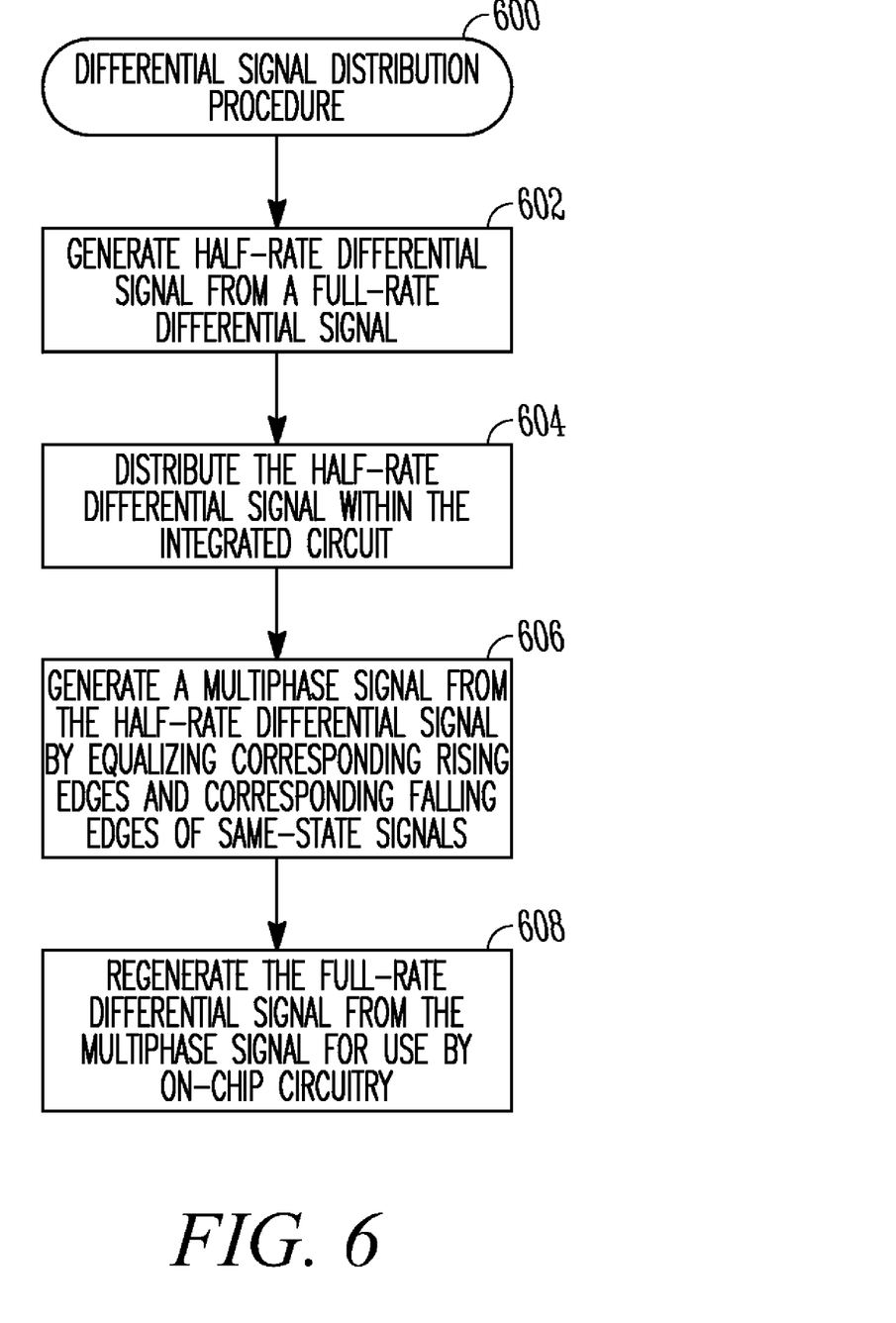
FIG. 6 is a flow chart of a differential signal distribution procedure in accordance with some embodiments of the invention.

FIG. 6 is a flow chart of a differential signal distribution procedure in accordance with some embodiments of the invention. Differential signal distribution procedure 600 may be performed by signal distribution circuitry, such as signal distribution circuitry 100 (FIG. 1), to distribute a differential signal within an integrated circuit, although other configuration of signal distribution circuitry may also be used to perform procedure 600. In these embodiments, a differential signal may be distributed within an integrated circuit at a lower rate, and subsequently regenerated for use within the integrated circuit. The effects of any DCD within the differential signal may be reduced and/or eliminated. Furthermore, distortion that is introduced by conventional distribution of high-rate differential signals may be avoided.

Operation 602 comprises generating a lower-rate differential signal from a full-rate differential signal. Clock divider circuitry, such as divide-by-two circuitry 102 (FIG. 1), may be used to generate differential signal 103 (FIG. 1) from differential input signal 101 (FIG. 1), although the scope of the invention is not limited in this respect.

Operation 604 comprises distributing the lower-rate differential signal within the integrated circuit. Differential signal 103 (FIG. 1) may be distributed within the integrated circuit over one or more signal distribution paths, such as signal distribution paths 113 (FIG. 1).

Operation 606 comprises generating a multiphase signal from the lower-rate differential signal by equalizing corresponding rising edges and corresponding falling edges of same-state signals. Operation 606 comprises generating multi-phase signal 105 (FIG. 1) with phase generator 104 (FIG. 1) from differential signal 103 (FIG. 1). Phase generator 200 (FIG. 2) may be used to generate multi-phase signal 205 (FIG. 2). In these embodiments, the phase generator may use a plurality of controllable delay stages and dual-edge phase detector circuitry to generate the multi-phase signal. The use of a plurality of controllable delay stages and dual-edge phase detector circuitry may help eliminate the effects that any DCD present in a lower-rate differential signal, such as half-rate differential signal 103 (FIG. 2), may have on the multi-phase signal.

Operation 608 comprises regenerating the full-rate differential signal from the multiphase signal for use by on-chip circuitry. Operation 608 may use a signal generator, such as one of signal generators 106 (FIG. 1), to generate the full-rate differential signal from the multi-phase signal generated in operation 606. The full-rate differential signal may be provided to on-chip circuits, such as on-chip circuitry 108 (FIG. 1). The full-rate differential signal may be provided to on-chip circuits, such as timing control circuitry 508 (FIG. 5), for use in communicating bi-directional data over a bi-directional data bus, such as bi-directional data bus 511 (FIG. 5), although the scope of these embodiments is not limited in this respect.

The description and drawings of this document sufficiently illustrate specific embodiments of the invention to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for, those of other embodiments. Embodiments of the invention set forth in the claims encompass all available equivalents of those claims. Embodiments of the invention may be referred to herein, individually or collectively, by the term "invention" merely for convenience and without intending to limit the scope of this application to any single invention or inventive concept if more than one is in fact disclosed.

Unless specifically stated otherwise, terms such as processing, computing, calculating, determining, displaying, or the like, may refer to an action and/or process of one or more processing or computing systems or similar devices that may manipulate and transform data represented as physical (e.g., electronic) quantities within a processing system's registers and memory into other data similarly represented as physical quantities within the processing system's registers or memories, or other such information storage, transmission or display devices. Furthermore, as used herein, a computing device includes one or more processing elements coupled with computer-readable memory that may be volatile or non-volatile memory or a combination thereof.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. Phase-generation circuitry comprising:
   a plurality of controllable delay stages arranged in series, each delay stage configured to phase shift a differential signal based on a control signal, the differential signal comprising a first component and a second component, wherein the plurality of controllable delay stages comprises at least first and second delay stages arranged in series,
   wherein the first delay stage is to delay the first and second components of the differential signal to provide respectively first and second components of a first phase-shifted signal,
   wherein the second delay stage is to delay the first and second components of the first phase-shifted signal to provide first and second components of the second phase-shifted signal; and
   phase detector circuitry configured to receive only the first component of the first and second components of the differential signal to generate the control signal based on a first time difference and a second time difference, the first time difference being between rising edges of the first component of the differential signal and a second component of a phase-shifted signal, the second time difference being between falling edges of the first component of the differential signal and the second component of the phase-shifted signal,
   wherein the phase detector circuitry is configured to adjust the control signal to attempt to equalize the first and the second time differences,
   wherein the first time difference is between rising edges of the first component of the differential signal and the second component of the second phase-shifted signal, and wherein the second time difference is between falling edges of the first component of the differential signal and the second component of the second phase-shifted signal, wherein the plurality of controllable delay stages comprises a third delay stage,
   wherein the third delay stage is to delay the first and second components of the second phase-shifted signal to provide first and second components of a third phase-shifted signal, and
   wherein the phase-generating circuitry is configured to generate a multiphase signal as an output.

2. The phase-generation circuitry of claim 1 wherein the first component of the differential signal, the first component of the first phase-shifted signal, the first component of the second phase-shifted signal, and the first component of the third phase-shifted signal comprises the multiphase signal.

3. The phase-generation circuitry of claim 1 wherein the control signal is to cause the controllable delay stages to either increase or decrease an amount of delay.

4. A method for generating a multiphase signal comprising:
   phase shifting a differential signal based on a control signal, the differential signal having an external rate and comprising a first component and a second component;
   generating the control signal to adjust the phase shifting to attempt to equalize a first time difference and a second time difference,
   wherein the first time difference is between rising edges of the first component of the differential signal and a second component of a phase-shifted signal, and
   wherein the second time difference is between falling edges of the first component of the differential signal and the second component of the phase-shifted signal,
   wherein the single control signal is generated from both the first time difference and the second time difference using dual-edge phase detection, and the dual-edge phase detection is configured to use only the first component of the first and second components of the differential signal;
   generating a multiphase signal from the differential signal using phase-generation circuitry;
   generating a differential output signal from the multiphase signal, the differential output signal having the external rate; and
   generating distributed differential signal from the differential signal using a clock-divider circuitry, and distributing the distributed differential signal between the clock-divider circuitry and the phase-generation circuitry.

5. Signal-distribution circuitry comprising:
   phase-generation circuitry configured to generate a multiphase signal from a differential signal having a first rate, the differential signal comprising a first component and a second component; and
   signal-generation circuitry configured to generate a differential output signal from the multiphase signal, the differential output signal having a second rate that is higher than the first rate;
   a signal-distribution path configured to distribute the distributed differential signal between the clock-divider circuitry and the phase-generation circuitry,
   wherein the phase-generation circuitry comprises:
   a plurality of controllable delay stages configured to phase shift the differential signal based on a control signal; and
   phase detector circuitry configured to receive only the first component of the first and second components of the differential signal to generate the control signal based on a first time difference and a second time difference, the first time difference being between rising edges of the first component of the differential signal and a second component of a phase-shifted signal, the second time difference being between falling edges of the first component of the differential signal and the second component of the phase-shifted signal,
   wherein the phase detector circuitry is configured to adjust the control signal to attempt to equalize the first and the second time differences.

6. A method for distributing a differential signal comprising:
   generating, by using a clock clock-divider circuitry, a distributed differential signal comprising a first component and a second component;

generating a multiphase signal from the distributed differential signal by using phase-generation circuitry;

generating a differential output signal from the multiphase signal at a rate higher than that of the distributed differential signal; and distributing the distributed differential signal between the clock-divider circuitry and the phase-generation circuitry through a signal-distribution path, wherein generating the multiphase signal comprises:

phase-shifting the distributed differential signal with a plurality of controllable delay stages; and adjusting a delay provided by each of the delay stages to attempt to equalize a first time difference and a second time difference, wherein the first time difference is between rising edges of the first component of the distributed differential signal and a second component of a phase-shifted signal, and wherein the second time difference is between falling edges of the first component of the distributed differential signal and the second component of the phase-shifted signal, and wherein the delay is adjusted based on a single control signal that is generated based on both the first and second time differences using dual-edge phase detection, and the dual-edge phase detection is configured to use only the first component of the first and second components of the distributed differential signal.

7. An integrated circuit comprising signal-distribution circuitry configured to distribute a differential signal at an internal rate, the signal-distribution circuitry comprising phase-generation circuitry, signal-generation circuitry, and an interface, wherein the phase-generation circuitry is configured to generate a multiphase signal from the distributed differential signal, the differential signal comprising a first component and a second component, wherein the phase-generation circuitry comprises:

a plurality of controllable delay stages arranged in series, each delay stage configured to phase shift the distributed differential signal based on a control signal; and phase detector circuitry configured to receive only the first component of the first and second components of the differential signal to generate the control signal to attempt to equalize a first time difference between rising edges of the first component of the distributed differential signal and a second component of a phase-shifted signal, and a second time difference between falling edges of the first component of the distributed differential signal and the second component of the phase-shifted signal, wherein the signal-generation circuitry is configured to generate a differential output signal from the multiphase signal, the differential output signal being at an external rate, and wherein the interface configured to communicate data based on the differential output signal; and a signal-distribution path configured to distribute the distributed differential signal between the clock-divider circuitry and the phase-generation circuitry.

8. The integrated circuit of claim 7, further comprising a bi-directional bus coupled to the interface.

9. Signal-distribution circuitry comprising:

clock-divider circuitry configured to generate a distributed differential signal having an internal rate from a differential signal having an external rate, the differential signal comprising a first component and a second component;

phase-generation circuitry configured to generate a multiphase signal from the distributed differential signal;

signal-generation circuitry configured to generate a differential output signal from the multiphase signal, the differential output signal being at the external rate; and a signal-distribution path configured to distribute the distributed differential signal between the clock-divider circuitry and the phase-generation circuitry, wherein the phase-generation circuitry comprises:

a plurality of controllable delay stages arranged in series, each delay stage configured to phase shift the distributed differential signal based on a control signal; and phase detector circuitry configured to receive only the first component of the first and second components of the differential signal to generate the control signal based on a first time difference and a second time difference, the first time difference being between rising edges of the first component of the differential signal and a second component of a phase-shifted signal, the second time difference being between falling edges of the first component of the differential signal and the second component of the phase-shifted signal, wherein the phase detector circuitry is configured to adjust the control signal to attempt to equalize the first and the second time differences.

10. A method comprising:

receiving a digital differential signal having a first rate, the digital differential signal comprising a first component and a second component;

distributing the digital differential signal at a second rate, wherein the second rate is lower than the first rate;

generating a multiphase signal from the distributed digital differential signal, wherein generating the multiphase signal comprises phase-shifting the distributed differential signal with a plurality of controllable delay stages; and adjusting a delay provided by each of the delay stages to attempt to equalize a first time difference and a second time difference, wherein the first time difference is between rising edges of the first component of the distributed differential signal and a second component of a phase-shifted signal, and wherein the second time difference is between falling edges of the first component of the distributed differential signal and the second component of the phase-shifted signal, and wherein the delay is adjusted based on a single control signal that is generated based on both the first and second time differences using dual-edge phase detection, and the dual-edge phase detection is configured to use only the first component of the first and second components of the differential signal.

* * * * *

UNITED STATES PATENT AND TRADEMARK OFFICE
CERTIFICATE OF CORRECTION

PATENT NO. : 8,330,508 B2
APPLICATION NO. : 12/766423
DATED : December 11, 2012
INVENTOR(S) : Feng Lin et al.

Page 1 of 1

It is certified that error appears in the above-identified patent and that said Letters Patent is hereby corrected as shown below:

In column 10, line 65, in Claim 6, delete "clock clock-divider" and insert -- clock-divider --, therefor.

Signed and Sealed this
Fifth Day of March, 2013

Teresa Stanek Rea
*Acting Director of the United States Patent and Trademark Office*